(12) United States Patent
Gorrell et al.

(10) Patent No.: US 9,407,213 B2
(45) Date of Patent: Aug. 2, 2016

(54) SYSTEM AND METHOD FOR ASSEMBLING A VOLTAGE AMPLIFIER

(71) Applicant: Carlisle Fluid Technologies, Inc., Charlotte, NC (US)

(72) Inventors: Brian Earl Gorrell, Angola, IN (US); James Paul Baltz, Waterville, OH (US)

(73) Assignee: Carlisle Fluid Technologies, Inc., Charlotte, NC (US)

( * ) Notice: Subject to any disclaimer, the term of this patent is extended or adjusted under 35 U.S.C. 154(b) by 240 days.

(21) Appl. No.: 13/964,841

(22) Filed: Aug. 12, 2013

(65) Prior Publication Data
US 2014/0077886 A1    Mar. 20, 2014

Related U.S. Application Data

(60) Provisional application No. 61/701,285, filed on Sep. 14, 2012.

(51) Int. Cl.
*H02M 3/18* (2006.01)
*H03F 3/10* (2006.01)
*H02M 7/10* (2006.01)

(52) U.S. Cl.
CPC .................. *H03F 3/10* (2013.01); *H02M 7/106* (2013.01); *Y10T 29/49016* (2015.01)

(58) Field of Classification Search
CPC ........ H02M 3/07; H02M 7/103; B05B 5/032; B05B 5/0531; H01T 19/00
USPC ......... 363/59, 60, 61; 361/225–235; 307/109, 307/110
See application file for complete search history.

(56) References Cited

U.S. PATENT DOCUMENTS

| | | | |
|---|---|---|---|
| 3,584,287 A | 6/1971 | Binoche | |
| 3,872,370 A | 3/1975 | Regnault | |

(Continued)

FOREIGN PATENT DOCUMENTS

| | | |
|---|---|---|
| DE | 1925879 | 1/1971 |
| DE | 1925879 A1 | 1/1971 |
| GB | 1368226 | 9/1974 |
| JP | S48-19444 B1 | 6/1973 |

OTHER PUBLICATIONS

International Search Report & Written Opinion for International Application No. PCT/US2013/054800 mailed Dec. 6, 2013.

(Continued)

*Primary Examiner* — Nguyen Tran
(74) *Attorney, Agent, or Firm* — Fletcher Yoder P.C.

(57) ABSTRACT

A voltage amplifier is provided that includes a first row and a second row each having a respective first or second plurality of capacitors arranged collinearly. First row capacitors comprise first terminals and second row capacitors comprise second terminals. The first row and second row are parallel to each other along longitudinal and lateral axes. A third row has a first plurality of diodes and a fourth row has a second plurality of diodes, each row positioned cross-wise to the first row and located above the first and second rows along the vertical axis. The first diodes are positioned parallel to each other along the longitudinal and lateral axes, and the second diodes are parallel to each other along the longitudinal and lateral axes and positioned cross-wise to and above the first plurality along the vertical axis. Diodes and capacitors are directly and physically connected using respective electrical leads.

20 Claims, 5 Drawing Sheets

(56) References Cited

U.S. PATENT DOCUMENTS

| | | | | |
|---|---|---|---|---|
| 3,902,108 | A | * | 8/1975 | Sion ............... B05B 5/0531 363/61 |
| 4,737,887 | A | * | 4/1988 | Thome ............. H02H 7/003 239/691 |
| 5,170,129 | A | | 12/1992 | Nobue et al. |
| 5,886,886 | A | * | 3/1999 | Teng ............... A01M 1/223 361/749 |
| 5,933,318 | A | | 8/1999 | Tomono et al. |
| 6,420,739 | B1 | | 7/2002 | Yokoi |
| 7,176,546 | B2 | | 2/2007 | Ahrens et al. |
| 7,443,899 | B2 | | 10/2008 | Ueki |
| 7,833,293 | B2 | | 11/2010 | Prymak et al. |
| 7,902,585 | B2 | | 3/2011 | Larson et al. |
| 7,969,711 | B2 | | 6/2011 | Prymak et al. |
| 8,351,213 | B2 | * | 1/2013 | Gorrell ............. H05K 1/183 361/743 |

OTHER PUBLICATIONS

Patent Application No. 2013316053—Patent Examination Report No. 1 mailed Jul. 7, 2015.

JP Office Action and English Translation; Application No. 2015-531932; Dated Mar. 1, 2016; 8 pages.

CA Examination Search Report; Application No. CA 2,883,937; Dated Apr. 1, 2016; 3 pages.

* cited by examiner

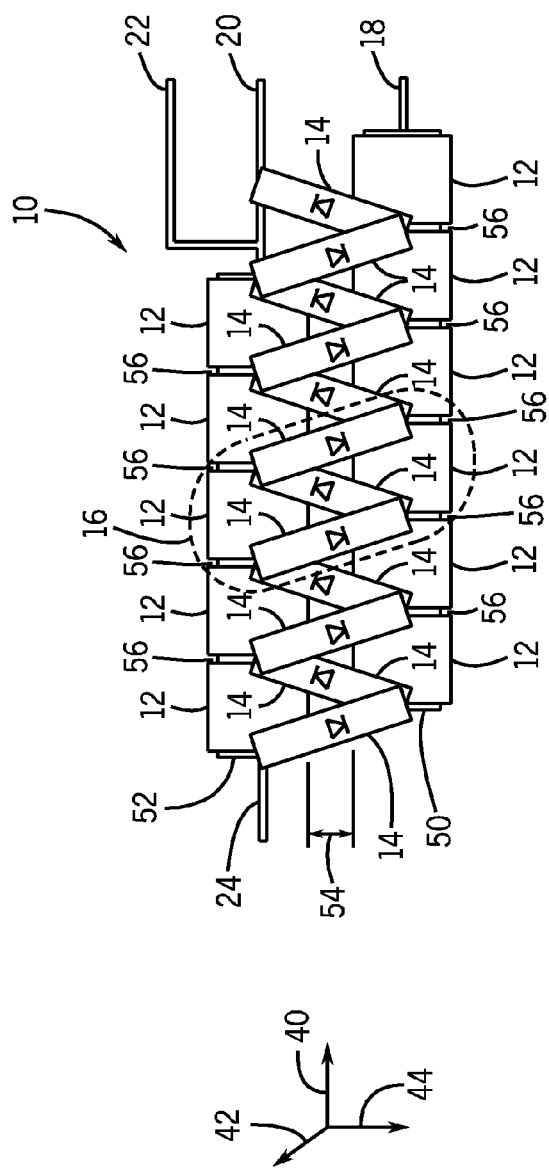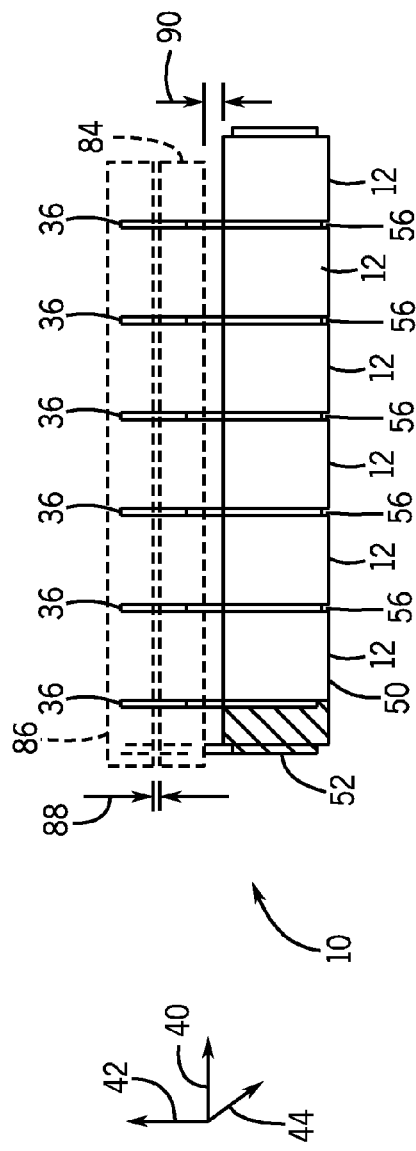

SYSTEM AND METHOD FOR ASSEMBLING A VOLTAGE AMPLIFIER

CROSS REFERENCE TO RELATED APPLICATION

This application claims priority from and the benefit of U.S. Patent Provisional Application Ser. No. 61/701,285, entitled "SYSTEM AND METHOD FOR ASSEMBLING A VOLTAGE AMPLIFIER", filed Sep. 14, 2012, which is hereby incorporated by reference in its entirety.

BACKGROUND

The invention relates generally to electronic components having diodes and capacitors, and, more particularly, to cascade voltage amplifiers.

Voltage amplifiers, specifically voltage multipliers, are electrical circuits that convert alternating current (AC) at a lower voltage to a direct current (DC) at a higher voltage. Voltage amplifiers have a wide-variety of uses such as relatively low voltages in household appliances or extremely high voltages in lightning safety testing facilities. Common voltage amplifiers often contain many electronic components (e.g., capacitors and diodes), thereby requiring a method for connecting and protecting each of the components. As the desire for smaller and lighter equipment employing voltage amplifiers (e.g., electrostatic spray guns) increases, it is desirable to reduce the size and weight of the voltage of the voltage amplifier assemblies themselves while increasing or maintaining the reliability of the voltage amplifiers.

BRIEF DESCRIPTION

In one embodiment, a voltage amplifier includes a first row having a first plurality of capacitors arranged collinearly, wherein each capacitor of the first row has a first terminal. Additionally, the voltage amplifier includes a second row horizontally parallel to the first row. The second row has a second plurality of capacitors arranged collinearly, and each capacitor of the second row has a second terminal. The voltage amplifier includes a third row having a first plurality of diodes positioned cross-wise to the first row and located vertically above the first and second rows. Moreover, the diodes of the first plurality of diodes are positioned horizontally parallel to each other. The voltage amplifier includes a fourth row having a second plurality of diodes cross-wise to the first row and located vertically above the third row. The diodes of the second plurality of diodes are positioned horizontally parallel to each other and positioned cross-wise to a respective diode of the first plurality of diodes. Additionally, the voltage amplifier includes a first plurality of electrical leads configured to directly physically connect the first plurality of capacitors to the first and second pluralities of diodes. Furthermore, the voltage amplifier includes a second plurality of electrical leads configured to directly physically connect the second plurality of capacitors to the first and second pluralities of diodes.

In a second embodiment, a method of manufacturing a voltage amplifier includes positioning a first diode vertically above a first capacitor. The method also includes directly physically coupling the first diode to a first terminal located on the first capacitor using a first lead located on the first diode. Additionally, the method includes directly physically coupling the first diode to a second terminal located on the second capacitor using a second lead located on the first diode. Moreover, the first diode is forward biased in a first direction. The method also includes positioning a second diode vertically above and positioned cross-wise to the first diode with the second diode forward biased in a second direction. The method further includes directly physically coupling the second diode to the first terminal using a third lead located on the second diode. Additionally, the method includes directly physically coupling the second diode to a third terminal located on the second capacitor using a fourth lead located on the second diode. Furthermore, the method includes arranging the first capacitor in a first row and the second capacitor in a second row.

In a third embodiments, an electronic device includes a printed circuit board and a voltage amplifier configured to couple to the printed circuit board. The voltage amplifier includes one or more stages with each stage configured to provide an output voltage approximately double an input voltage. Each stage comprises a plurality of diodes, a plurality of capacitors arranged in a first row and a second row, a plurality of junctions directly physically connecting the first diode lead to the first terminal, an input node directly physically connected to the printed circuit board, and an output node directly physically connected to the printed circuit board. Moreover, each of the plurality of diodes includes a diode body, a first diode lead, and a second diode lead. Additionally, each of the plurality of capacitors includes a capacitor body, a first terminal, and a second terminal The first and second diode leads of each diode provide a framework for the voltage amplifier junctions. The first diode lead directly physically connects one or more terminals within the first row and the second diode lead directly physically connects one or more terminals within the second row. Each junction couples a first terminal from one of the plurality of capacitors with a second terminal of an adjacent capacitor with two diodes of the plurality of diodes. Furthermore, each of the junctions is remote from the printed circuit board.

DRAWINGS

These and other features, aspects, and advantages of the present invention will become better understood when the following detailed description is read with reference to the accompanying drawings in which like characters represent like parts throughout the drawings, wherein:

FIG. 3 is a top view of an another embodiment of the voltage multiplier assembled without a printed circuit board;

FIG. 5 is a side view of an embodiment of the voltage multiplier of FIG. 3 with diodes omitted for clarity.

DETAILED DESCRIPTION

Figure 1:
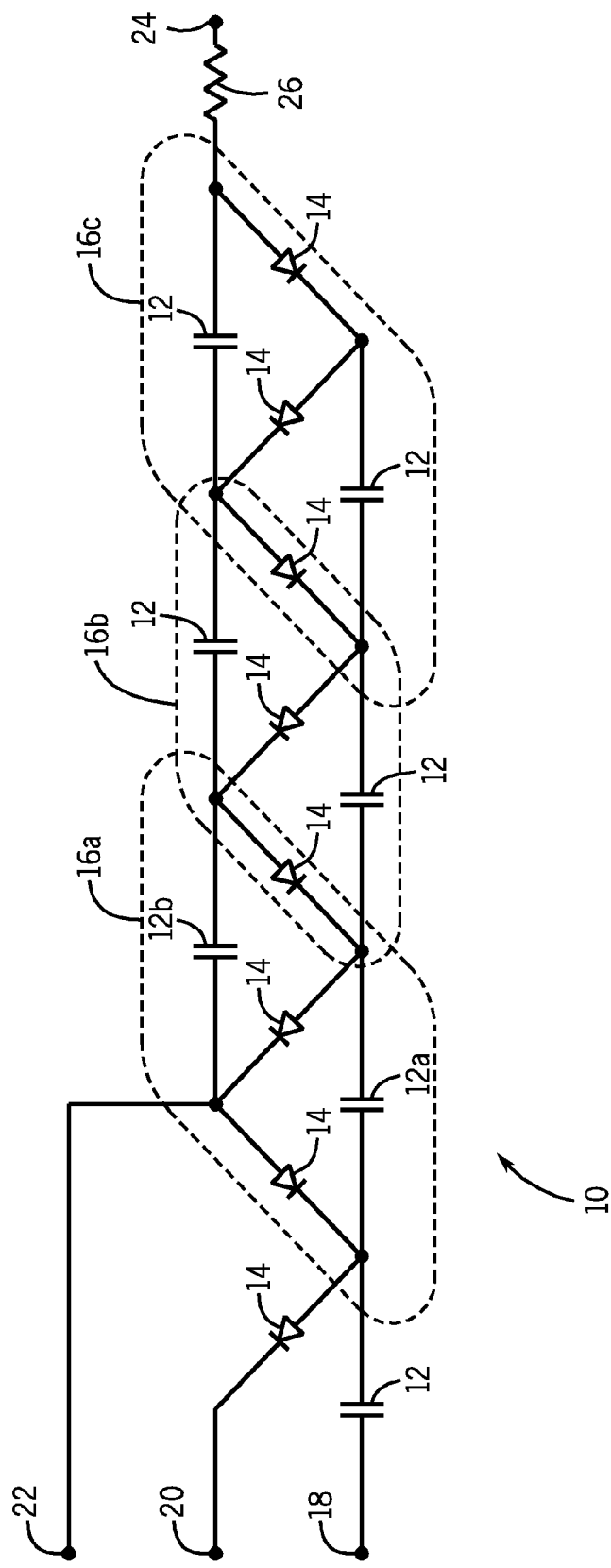
FIG. 1 is a schematic diagram illustrating an embodiment of a voltage multiplier.

One or more specific embodiments of the present disclosure will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," "the," and "said" are intended to mean that there are one or more of the elements. The terms "comprising," "including," and "having" are intended to be inclusive and mean that there may be additional elements other than the listed elements. Any examples of operating parameters and/or environmental conditions are not exclusive of other parameters/conditions of the disclosed embodiments.

Various embodiments of the present disclosure include a cascade voltage amplifier within a voltage amplifier assembly. The voltage amplifier assembly receives an AC voltage and converts the AC voltage to a higher DC voltage. As discussed in detail below, certain embodiments of the voltage amplifier assembly include multiple capacitors and diodes arranged in a Cockroft-Walton generator configuration. The capacitors and diodes are directly physically coupled using the leads from the capacitors and/or diodes rather than soldering each component to a printed circuit board. By using the capacitor leads and/or diode leads to make connections instead of using a printed circuit board to connect to each individual electrical component (e.g., capacitor or diode), the voltage amplifier assembly may be made smaller and/or lighter than voltage amplifier by providing input/output nodes for the voltage amplifier assemblies requiring printed circuit board connections between each of the individual components. Additionally, by omitting the printed circuit board connection between each of the individual components, the voltage amplifier assembly may be coated in a protective coating before connecting the voltage amplifier to a circuit board to reduce flashover on the individual components. Additionally, various embodiments of the voltage amplifier assembly enable the repeating of sub-assemblies (e.g., stages) to achieve a desired ratio of output voltage to input voltage rather than being restricted by the printed circuit board size. Finally, by performing the construction of the voltage amplifier circuits without a printed circuit board, the process may be completed at one location thereby reducing further manufacturing issues such as contamination on the surface or moisture the printed boards, sharp solder joints, and contact cleaning (e.g., removing flux residue).

Turning now to the drawings, FIG. 1 is a schematic view of an embodiment of a voltage amplifier 10. The illustrated embodiment of the voltage amplifier 10 is a Cockroft-Walton multiplier, but certain embodiments may include any voltage amplifier having capacitors and diodes, such as a Greinacher multiplier or other electronic circuits, suitable for amplifying voltages. The voltage amplifier 10 has multiple capacitors 12 and diodes 14. The capacitors may be any type of capacitor suitable for voltage amplification, such as ceramic capacitors. As can be appreciated the capacitors 12 and the diodes 14 are arranged into one or more stages 16. In the illustrated embodiment, the voltage amplifier has 3 stages, but other embodiments of the voltage amplifier 10 may have 1, 2, 3, 4, 5, 6, or more stages. As discussed below and as one of ordinary skill could appreciate, each stage 16 approximately doubles the voltage of an input voltage 18. The input voltage 18 may be any suitable AC input such as 5V, 10V, 15V, 20V, 25V, 5 kV, 10 kV, 15 kV, 20 kV, 25 kV, or greater provided from a generator, transformer, or other suitable source. The voltage amplifier 10 further includes an IFBD (function block diagram input current) connection 20 and a ground connection 22.

As can be appreciated, when the AC input 18 reaches a negative peak, the input 18 charges the capacitor 12$a$ in a stage 16$a$. When the polarity of the AC input 18 reverses the capacitor 12$a$ discharges and fills capacitor 12$b$ in the stage 16 to approximately twice the charge of the first capacitor. When the AC input again reverse polarity, the capacitor 12$b$, and thus the stage 16$a$, discharges a voltage approximately twice the input voltage. This voltage then may be passed along the voltage amplifier 10 further boosted by stages 16$b$ and 16$c$. Accordingly, the voltage amplifier 10 would supply an output voltage 24 that is twice the amplitude of the input voltage 18 multiplied by the number of stages 16 (assuming perfect conditions and ignoring power dissipation through the system). Specifically, the illustrated embodiment of the voltage amplifier 10 would produce an output voltage 24 approximately 6 times the input voltage 18. For example, if the input voltage 18 were 10 kV, the output voltage 24 would approximately be 60 kV. In other embodiments, the number of stages 16 and amplitude of the input voltage 18 may be selected such that the output voltage is −100V, 45 kV, 65 kV, 85 kV, 100 kV, a voltage above 100 kV, or any subset of voltages therebetween.

The output voltage 24 may then be supplied to any suitable electronic circuit either within an electronic device including the voltage amplifier 10 or to an electronic circuit separate from the voltage amplifier. Finally, the illustrated embodiment of the voltage amplifier 10 includes a resistor 26 that may represent a load or line resistance in the voltage amplifier 10 or within an electronic device utilizing the voltage amplifier 10. Also, as can be appreciated, other various electrical components known in the art may be connected to the voltage amplifier 10 to filter signals, regulate voltages, regulate current, or other suitable electrical circuit controls.

Figure 2:
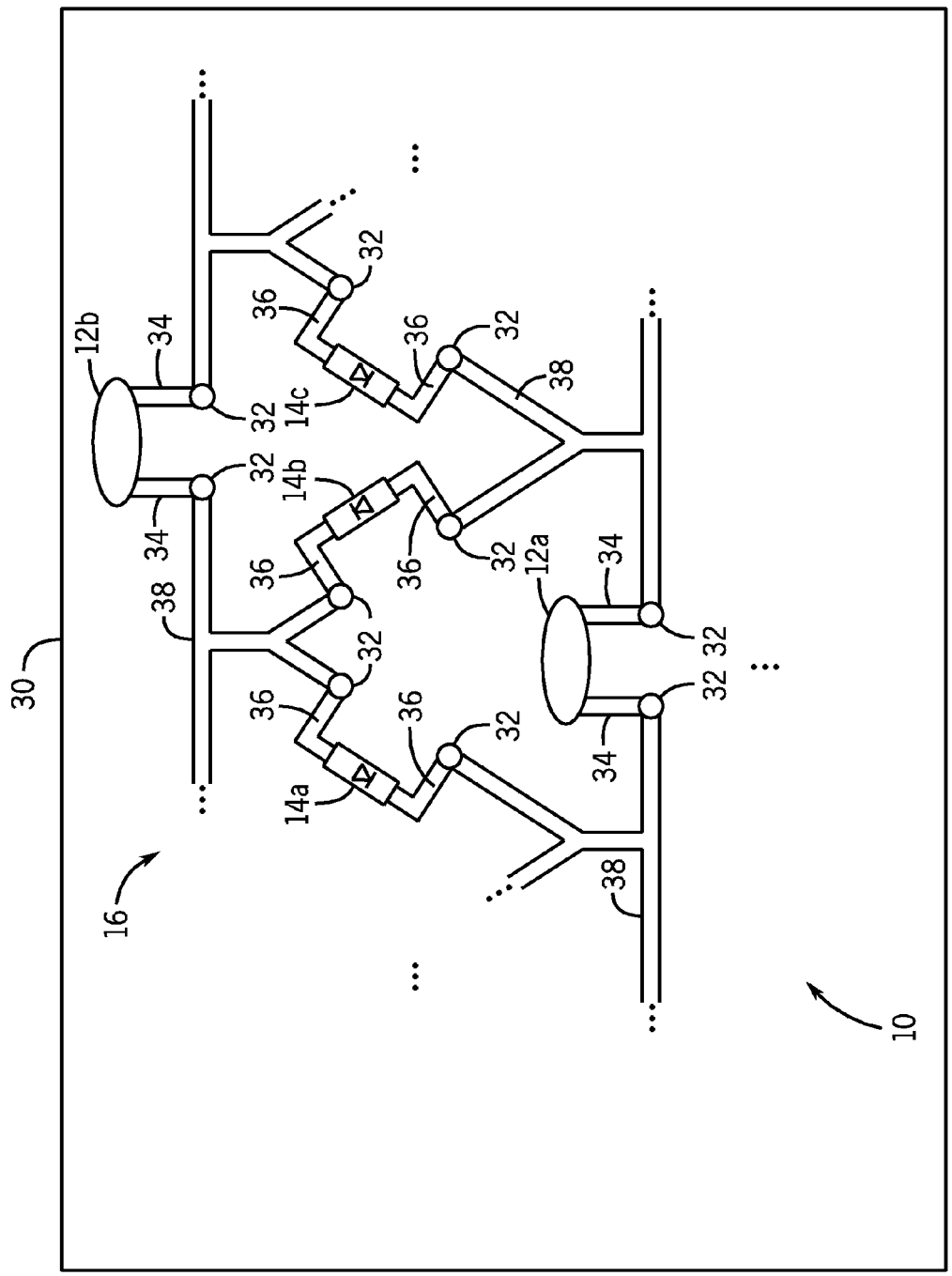
FIG. 2 is a perspective view of an embodiment of the voltage multiplier on a printed circuit board.

FIG. 2 is a perspective view of an embodiment of the voltage amplifier 10 having each diode 14 and capacitor 12 directly physically connected to a circuit board 30. The board 30 may be a printed circuit board within an electronic device using the voltage multiplier while performing additional functions for the electronic device or may be an electronic component solely dedicated to voltage amplification. For example, the board 30 may be a printed circuit board connected to a controller 29 controlling flow through an electrostatic spray system 31 and located within a spray gun for the electrostatic spraying system 31. In other embodiments, the board 30 may be dedicated solely to providing a location for the voltage amplifier 10. Moreover, the current embodiment only shows one stage 16 of the voltage amplifier 10, but the board 30 may couple to 2, 3, 4, or more stages, depending on the desired output voltage 24 of the voltage amplifier 10 in relation to the desired input voltage 18.

In the illustrated embodiment, the printed circuit board 30 provides structural support to the capacitors 12 and the diodes 14 by connecting the capacitors 12$a$ and 12$b$ and diodes 14$a$, 14$b$, and 14$c$ to the printed circuit board 30 via attachment features 32. In certain embodiments, each attachment feature 32 may be pads, holes, or another suitable connector configured to receive a capacitor lead 34 and/or diode lead 36. In some embodiments, the board 30 may include attachment features 32 combining multiple types of connections (e.g., holes and pads). For example, a when using large capacitors, through-hole technologies may be used to couple a capacitor 12 to the board 30 while using surface-mounting to couple a diode 14 to the board 30. In each embodiment, the capacitor leads 34 and the diode leads 36 are soldered to the board 30 at the attachment features 32 either on the surface, within the hole, or on the opposite surface of the board 30.

In addition to providing structural support to the capacitors 12 and the diodes 14, the board 30 electrically interconnects the capacitors 12 and the diodes 14 using signal traces 38. The illustrated embodiment includes three substantially y-shaped signal traces for the stage 16, but other embodiments may include any shape suitable for connecting the diodes 14 and the capacitors 12 in the voltage amplifier 10.

FIG. 3 is a top view of another embodiment of the voltage amplifier 10 assembled without a printed circuit board, breadboard, or other boarded interconnection methods. For the purposes of discussion, reference may be made to a longitudinal axis 40, a vertical axis 42, and a lateral axis 44 with the horizontal plane formed by the intersection of the longitudinal axis 40 and the lateral axis 44. As illustrated each of the capacitors 12 are arranged into a first row 50 and a second row 52. The rows are arranged such that a row gap 54 exists between the first row 50 and the second row 52. In certain embodiments, the gap 54 may be between 0.03 and 0.07 inches, between 0.05 and 06 inches, or any of the subsets therein. Furthermore, of the capacitors 12, in each of the rows include a capacitor junction 56. Each capacitor junction 56 may be designed to maintain a desired distance to space the capacitors to limit voltage flashover and/or heat transfer. For example, in certain embodiments, the capacitor junction 56 may be selected to be between 0.100 and 0.125 inches, between 0.005 and 0.130 inches, between 0.005 and 0.2 inches, or any of the subsets therein. This distance may be maintained by a spacer, a capacitor lead 34, or a diode lead 36. Additionally, each of the capacitors 12 is electrically connected to the adjacent capacitor 12 in the same row (e.g., first row 50). This electrical connection may be performed by physical contact between terminals on the capacitors 12, a spacer, a capacitor lead 34, or a diode lead 36. The rows 50 and 52 are electrically interconnected through multiple diodes 14. Specifically, each capacitor junction 56 couples to two diodes 14 each biased in opposite directions. In other words, one diode 14 is biased toward the junction 56, and the other diode is biased 14 away from the junction 56.

As discussed in detail below, the diode leads 36 or the capacitor leads 36 may be used to interconnect the capacitors 12 and the diodes 14 to provide a skeletal framework to the voltage amplifier 10 thus providing at least some structural support for the voltage amplifier 10. As discussed below, in some embodiments, this structural support may be further enforced by other materials (e.g., epoxy coating).

Figure 4:
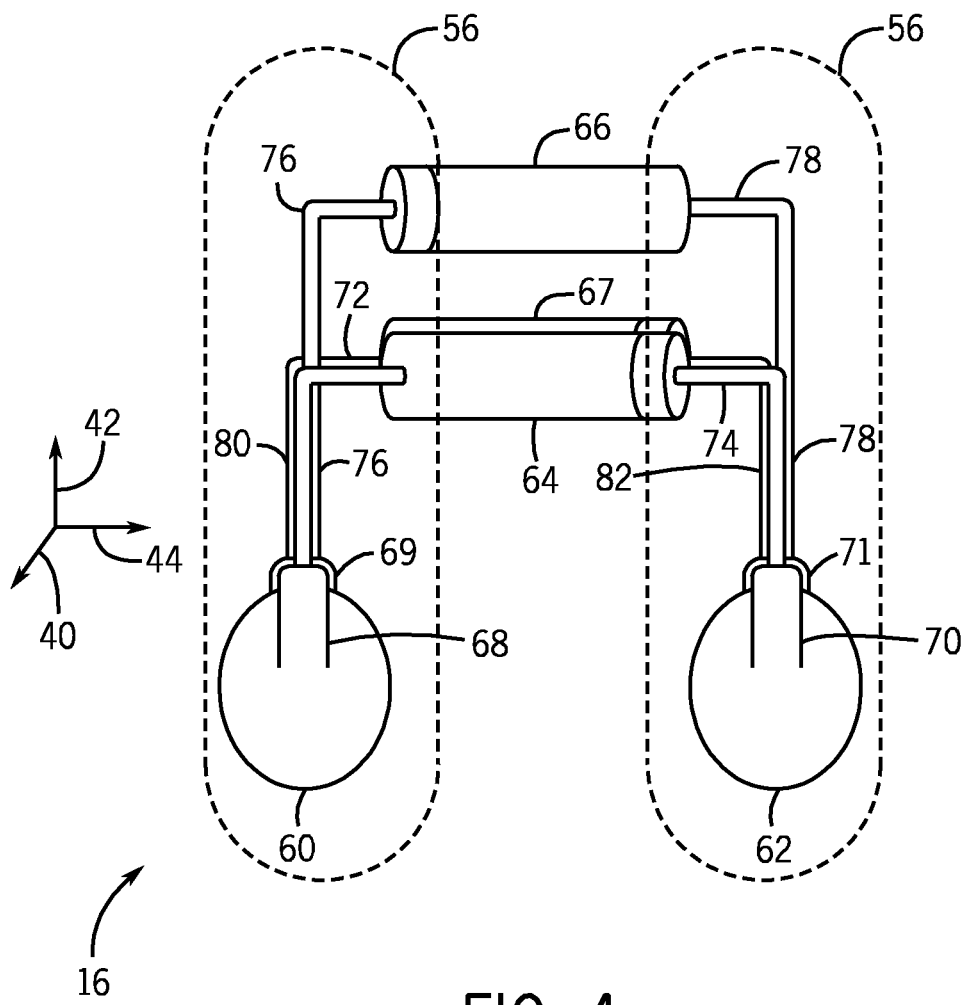
FIG. 4 is a side view of a connection of two capacitors in the voltage multiplier of FIG. 3 illustrating an orientation of two diodes in respect to the capacitors.

FIG. 4 is a side view of a stage 16 of the voltage amplifier 10 of FIG. 3. The stage 16 includes two capacitors such as the first capacitor 60 and the second capacitor 62. The capacitors represent capacitors 12 in the stage 16 located in each of the rows (e.g., first row 50 and second row 52). Specifically, the first capacitor 60 may be located in the first row 50, and the second capacitor 62 may be located in the second row 52. Stage 16 further includes three diodes, although, as illustrated in FIG. 1, some diodes may be shared between multiple stages 16. The illustrated stage 16 illustrates a first diode 64, a second diode 66, and a third diode 67 located behind in the lateral direction 44 and parallel to the first diode 64 in a horizontal direction (e.g., plane intersecting the longitudinal direction 42 and the lateral direction 44). Additionally, the first capacitor 60 has a first terminal 68 with a first rear terminal 69 disposed on opposite ends of the first capacitor 60. Similarly, the second capacitor 62 has a second terminal 70 and a second rear terminal 71 disposed on opposite ends of the second capacitor 62. Moreover, the first diode 64 has a first lead 72 and a second lead 74, and the second diode 66 has a third lead 76 and a fourth lead 78. Additionally, the third diode 67 has a fifth lead 80 and a sixth lead 82.

The first lead 72 of the first diode 64 is electrically connected to the first terminal 68, and the first diode is electrically reverse biased with respect to the first terminal 68. The second lead 74 is electrically connected to the second terminal 70. Similarly, the third lead 76 of the second diode 66 is electrically coupled to the first terminal 68, and the second diode 66 is forward biased with respect to the first terminal 68. The fourth lead 78 is electrically coupled to the second rear terminal 71. Finally, fifth lead 80 is coupled to the first rear terminal 69 and the sixth lead 82 is coupled to the second rear terminal 71. Moreover, the third diode 67 is forward biased with respect to the second rear terminal 71. Furthermore, the third diode 67 is physically parallel to the first diode 64 such that the first diode 64 and the third diode form a row of diodes 14 within the voltage amplifier 10. In various embodiments, each of the leads may be electrically connected to a respective terminal using various soldering techniques known in the art, such as reflow soldering, wave soldering, manual soldering, infrared soldering, laser soldering, or some combination therein. Alternatively or additionally, some embodiment may form the electrical connections using cold soldering, or conductive adhesives (e.g., conductive epoxy), or non-conductive adhesives.

FIG. 5 is a side view of an embodiment of the voltage multiplier of FIG. 3 with individual diodes 14 omitted for clarity. The illustrated embodiment of the voltage amplifier 10 shows the first row 50 with the second row 52 located parallel to and behind the first row 50. The diode leads 36 remain in FIG. 5 to illustrate the interconnection of the diodes 14 and the capacitors 12 within each row. As can be appreciated, each diode lead 36 is connected a capacitor junction connecting the terminals for two capacitors. As can be appreciated, the diode leads 36 provide structural support to the structure in addition to providing electrical connectivity between the diodes 14 and the capacitors 12. In other words, one diode lead 34 electrically connects two capacitors 12 and a diode 14. Moreover, the diode leads 36 provide structural support in preparation for a dielectric coating (not shown) which adds further structural support to the voltage amplifier 10 to assist in strengthening the voltage amplifier 10. Additionally, the dielectric coating (not shown) substantially limits voltage flashover probability as well as protects the voltage amplifier 10 from interference from external sources, such as electricity, dirt, heat, etc.

Returning to FIG. 5, the diodes 14 are arranged into a lower row 84 and an upper row 86. In certain embodiments, each of the diodes 14 in the lower row 84 are forward biased in one lateral direction 44, and each of the diodes 14 in the upper row are forward biased in an opposite lateral direction 44. As can be appreciated, by placing the diodes 14 in rows according to bias direction, the voltage amplifier 10 may be constructed more compactly. However, close proximity of diodes 14 at high voltage increases the possibility of voltage flashover. Therefore, the lower row 84 and the upper row 86 are installed with a diode gap 88 between the rows 84, 86 to reduce the probability of voltage flashover. However, the width of the gap 88 may be kept minimal to reduce the size of the voltage amplifier 10. For example, in certain embodiments, the gap 88 may be designed to be between 0.100 and 0.125 inches, between 0.005 and 0.130 inches, between 0.005 and 0.2 inches, or any of the subsets therein. Similarly, an inter-component gap 90 is left between the lower row 84 and the capacitors 12 (e.g., first row 50 and/or second row 52) to lessen voltage flashover probability. In certain embodiments, the inter-component gap 90 may be designed to be between 0.050 and 0.060 inches, between 0.003 and 0.130 inches, between 0.005 and 0.2 inches, or any of the subsets therein. Additionally, some embodiments include filling the gaps 88, 90 with a dielectric coating to further reduce voltage flashover probability.

As can be appreciated, by locating the diodes 14 above the capacitors 12 in the vertical direction 42 and using the diode leads 36 to perform the interconnections, the voltage amplifier 10 is lighter and smaller than a voltage amplifier using a printed circuit board directly physically connected to each individual component. Additionally, all of the components may be connected and cleaned during a manufacturing process and then coated with a dielectric epoxy to seal the entire voltage amplifier 10 preventing subsequent contamination.

Figure 6:
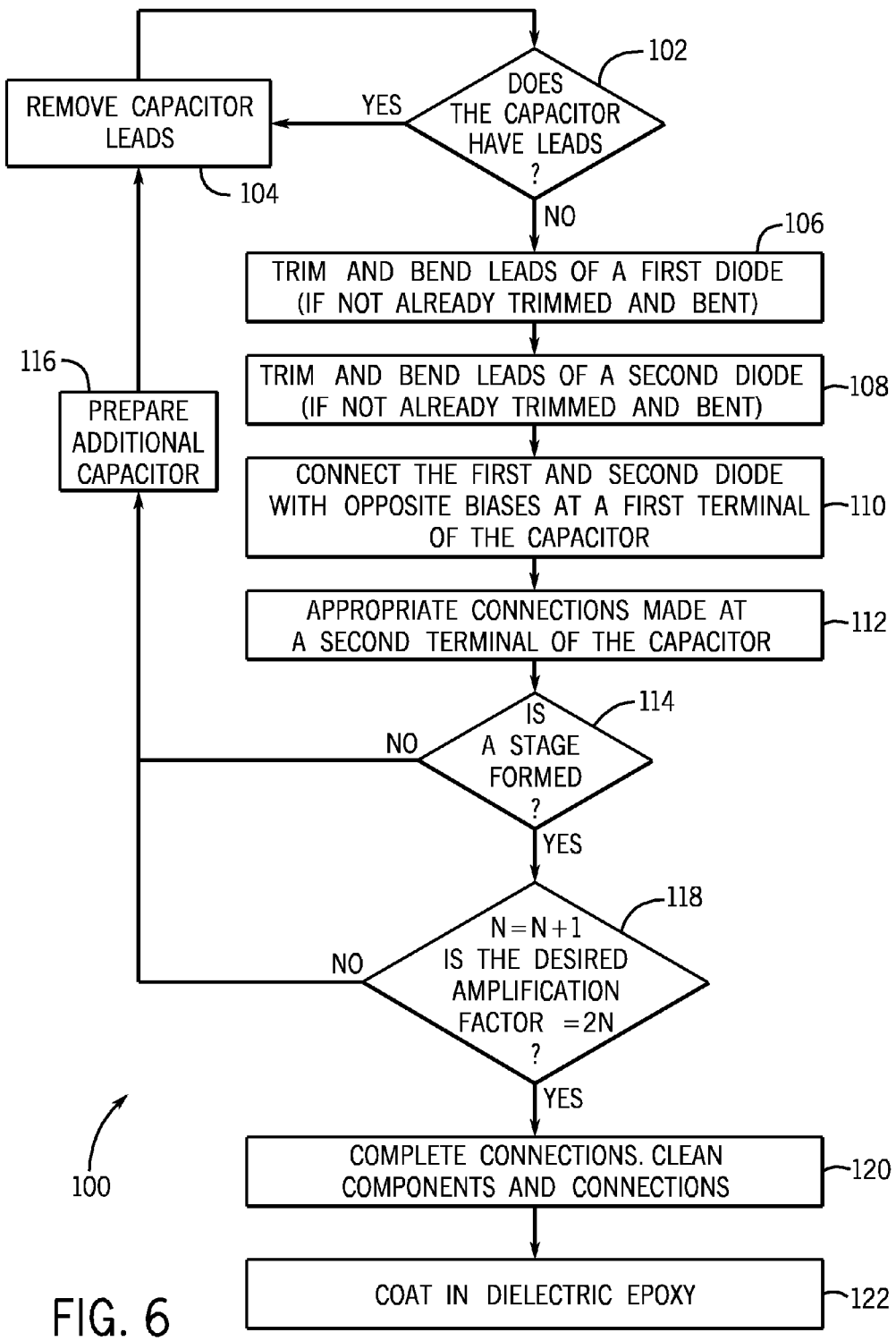
FIG. 6 is a block diagram illustrating a method of manufacturing the voltage multiplier of FIG. 3.

For example, one process 100 of manufacturing an embodiment of the voltage amplifier 10 is shown in FIG. 6. In the illustrated embodiment, the process 100 includes first determining whether a capacitor 12 has capacitor leads 34 extending from body of the capacitor 12 (block 102). If the capacitor 12 has leads 34, the leads 34 are cut/removed at the terminals of the capacitor (block 104). Now that the capacitor 12 is lead-less, the capacitor 12 is prepared for connection to the diodes 14. Next, one or more diodes 14 for the lower row 84 may be prepared by bending the diode leads 36 and trimming the diode lead(s) 36 to enable the attachment of the diode(s) 14 to a capacitor 12 to achieve the selected distance for the inter-component gap 90 (block 206). Similarly, one or more diodes 14 are prepared by bending the diode leads 36 and trimming the diode lead(s) 36 to enable the attachment of the diode(s) 14 to a capacitor 12 to achieve the selected distance for the diode gap 88 (block 108).

In some embodiments, each of the diodes 14 to be used in the voltage amplifier 10 may be prepared individually before attaching each diode 14, but other embodiments may include preparing all diodes 14 for a row (e.g., upper row 86) at one time followed by preparing all diodes 14 for the designed another row (e.g., lower row 84). Additionally, certain embodiments may include bending all diode leads 16 for both rows 84, 86 at one time and trimming the leads 36 at a later time according to desired length for the row. Furthermore, each diode 14 may be bent by hand, automation, or some combination thereof. Moreover, some embodiments of the method 100 may omit blocks 106 and 108 by having the diodes 14 manufactured or delivered with diode leads 36 already prepared for installation within the voltage amplifier 10. In some embodiments, blocks 106 and 108 may be omitted during some recursions of the process because the capacitor 12 may be connected to one or more diodes 14 already connected and bent to other capacitors 12. Additionally or alternatively, some embodiments may include trimming and connecting the leads 36 to capacitors 12 then bending each diode leads 36 at a subsequent step rather than in one step (e.g., blocks 106 and 108 may be split into separate bending and trimming steps with block 110 intervening the split steps). For example, some embodiments may include bending the diode leads 36 of one row 84 or 86 after each of the desired capacitors 12 are interconnected.

Returning to FIG. 6, once the diodes 14 have been prepared for installation within a system, a diode lead 72 from a first diode 64 is electrically connected to the first terminal 68 of the capacitor 12 and a diode lead 76 from the second diode is electrically connected to the first terminal 68 of the capacitor 12 with each (block 110). After the connections are made at the first terminal 68, appropriate connections are made to a first rear terminal 69 to construct the voltage amplifier. For example, similar to the connections at the first terminal 68, the first rear terminal 69 of the capacitor may be connected to two diodes biased in opposite directions with one diode located in the lower row 84 and the other diode located in the upper row 86. In certain embodiments, the first rear terminal 69 may be connected to external leads or additional capacitors 12 to complete the connections in suitable arrangements, such as the schematic illustrated in FIG. 1. Moreover, these connections may be made using solder, a conductive adhesive, a pre-soldering adhesive, or other suitable connections for electrically connecting or preparing the parts for soldering.

Once the capacitor 12 is connected to the diodes 14 and/or the voltage amplifier 10, determine whether a stage 16 has been formed (block 114). In other words, does the newly connected capacitor 12 have a pair capacitor (e.g., capacitors 60 and 62) connected as a stage 16. If the capacitor 12 does not have a paired capacitor, prepare another capacitor 12 for connection to the voltage amplifier 10 (block 116). If the capacitor 12 has a paired capacitor, add 1 to the total number of stages contained in the voltage amplifier 10 (n=n+1) and determine if the desired amplification factor (e.g., 8×) is twice (2n) the number of stages (block 118). If n does not equal the desired amplification factor, prepare another capacitor for connection to the voltage amplifier 10 (block 116). If n equals the desired amplification factor, complete connections and clean components and connections (block 120). For example, additional external leads, diodes 14, capacitors 12, resistors, and other electrical components/connections may be added to complete a designed voltage amplifier 10 (e.g., such as voltage amplifier 10 illustrated in FIG. 1). Also, completing connections may include soldering (e.g. flow soldering) the components, if the original connections in block 110 were not made by soldering components or additional soldering is desired. The components and connections may be cleaned using friction (e.g., brush), distilled water, and/or other fluid to remove impurities, potential interfering particles, and/or residue (e.g., flux residue or adhesive residue). Finally, the voltage amplifier 10 is coated in a dielectric coating (block 122). In certain embodiments, the coating may be formed using a potting process to dispose a plastic (e.g., polyurethane), silicone, and/or epoxy coating on the voltage amplifier 10. This application of a dielectric coating provides structural support to the voltage amplifier 10 and provides resistance to shock and vibration. Additionally, the dielectric coating excludes moisture, corrosive agents, or other particles that would interfere with the operation of the voltage amplifier 10.

By omitting connections between the individual components and a printed circuit board by installing capacitors 12 directly to the diode leads 36, voltage amplifier 10 weight and costs of manufacture are both reduced. Furthermore, since the voltage amplifier 10 size is dependent solely on the chosen amplification factor, space is saved, and the voltage amplifier 10 is not limited to a size controlled by a size of the board. Additionally, by connecting the capacitors 12 and diodes 14 directly to each other then coating with a dielectric material, the voltage amplifier 10 is made more reliable because heat transfer issues and voltage flashover probability are decreased within a more compact spacing than a voltage amplifier 10 using individual connections of each component to a circuit board. Moreover, by connecting the capacitors 12 and diodes 14 together then coating in epoxy, the voltage amplifier 10 may be manufactured at one location at one occasion rather than requiring baking of a pc board and other additional time consuming steps used to manufacture a voltage amplifier 10 on a printed circuit board 30. Furthermore, by enabling the manufacture of the voltage amplifier 10 at one location at one time, the probability of contamination and time used to clean the voltage amplifier 10 may be reduced.

Finally, if all the soldering is done at one time then coated in a dielectric material, the voltage amplifier 10 may be more reliable because the risk associated with sharp solder joints is practically removed.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A voltage amplifier, comprising:
   a first row comprising a first plurality of capacitors arranged collinearly, wherein each capacitor of the first row comprises a first terminal;
   a second row parallel to the first row in a first horizontal plane formed by a longitudinal axis and a lateral axis, wherein the second row comprises a second plurality of capacitors arranged collinearly, wherein each capacitor of the second row comprises a second terminal;
   a third row comprising a first plurality of diodes positioned cross-wise to the first row and located above the first and second rows along a vertical axis, wherein the diodes of the first plurality of diodes are positioned parallel to each other in a second horizontal plane formed from an intersection of the longitudinal and lateral axes;
   a fourth row comprising a second plurality of diodes positioned cross-wise to the first row and located above the third row along the vertical axis, wherein the diodes of the second plurality of diodes are positioned parallel to each other in a third horizontal plane formed from an intersection of the longitudinal and lateral axes, and each of the diodes of the second plurality of diodes is positioned cross-wise to a respective diode of the first plurality of diodes;
   a first plurality of electrical leads configured to directly physically connect the first plurality of capacitors to the first and second pluralities of diodes; and
   a second plurality of electrical leads configured to directly physically connect the second plurality of capacitors to the first and second pluralities of diodes.

2. The voltage amplifier of claim 1, wherein the first plurality of electrical leads and the second plurality of electrical leads protrude from each diode of the first plurality of diodes and the second plurality of diodes as diode leads.

3. The voltage amplifier of claim 2, wherein each of the diode leads comprise one or more bends that cause each of the diode leads to extend from the third row or fourth row to the first terminal or the second terminal, respectively.

4. The voltage amplifier of claim 3, wherein the diode leads comprise a length and a shape combination that creates an inter-component gap between the first row and the third row.

5. The voltage amplifier of claim 4, wherein the inter-component gap comprises a 0.056 inch distance between the first row and the third row.

6. The voltage amplifier of claim 3, wherein the diode leads comprise a length and a shape combination that creates a diode gap between the third row and the fourth row.

7. The voltage amplifier of claim 6, wherein the diode gap comprises a 0.020 inch distance between the third row and the fourth row.

8. The voltage amplifier of claim 1, comprising a support structure for the voltage amplifier, wherein the support structure comprises a dielectric epoxy layer.

9. The voltage amplifier of claim 1, wherein voltage amplifier comprises:
   a printed circuit board;
   an input node; and
   an output node, wherein the input and output nodes are the sole couplings to the printed circuit board.

10. The voltage amplifier of claim 1, wherein each of the first plurality of diodes are forward biased with respect to the first row, and each of the second plurality of diodes are forward biased with respect to the second row.

11. A method of manufacturing a voltage amplifier, comprising:
    positioning a first diode above a first capacitor along a vertical axis;
    directly physically coupling the first diode to a first terminal located on the first capacitor using a first lead located on the first diode;
    directly physically coupling the first diode to a second terminal located on the second capacitor using a second lead located on the first diode, wherein the first diode is forward biased in a first direction;
    positioning the second diode above the second capacitor along the vertical axis such that the second diode is above the first diode that is above the first capacitor along the vertical axis;
    directly physically coupling the second diode to the first terminal using a third lead located on the second diode;
    directly physically coupling the second diode to a third terminal located on the second capacitor using a fourth lead located on the second diode;
    arranging the first capacitor in a first row and the second capacitor in a second row.

12. The method of claim 11, comprising:
    positioning a third diode horizontally adjacent and parallel to the first diode in a horizontal plane formed from an intersection of longitudinal and lateral axes;
    coupling the third diode to the third terminal using a fifth lead located on the third diode; and
    coupling the third diode to a fourth terminal located on the first capacitor using a sixth lead located on the third diode, wherein the third diode is forward biased in the first direction.

13. The method of claim 12, comprising:
    positioning a third capacitor in the first row adjacent to the first capacitor;
    coupling the third capacitor to the sixth lead;
    positioning a fourth capacitor in the second row adjacent to the second capacitor; and
    coupling the fourth capacitor to the fifth lead.

14. The method of claim 11, wherein the first and second diodes are coupled by soldering a respective lead to a respective terminal.

15. The method of claim 14, comprising applying an adhesive to each coupling before soldering the respective lead to the respective terminal.

16. The method of claim 11, comprising potting the voltage amplifier to form a dielectric coating.

17. An electronic device, comprising:
    a printed circuit board;
    a voltage amplifier comprising:
       one or more stages, wherein each stage is configured to provide an output voltage approximately double an input voltage, and wherein each stage comprises:
          a plurality of diodes, each comprising:
             a diode body;
             a first diode lead; and
             a second diode lead;

a plurality of capacitors arranged in a first row and a second row wherein each of the plurality of capacitors are located within a capacitor plane, wherein each capacitor comprises:
  a capacitor body;
  a first terminal; and
  a second terminal;
a plurality of junctions directly physically connecting the first diode lead to the first terminal;
an input node directly physically connected to the printed circuit board; and
an output node directly physically connected to the printed circuit board, wherein the first and second diode leads of each diode provide a framework for the voltage amplifier junctions, wherein the first diode lead electrically connects one or more terminals within the first row and the second diode electrically connects or more terminals within the second row, wherein each junction couples a first terminal from one of the plurality of capacitors with a second terminal of an adjacent capacitor with two diodes of the plurality of diodes, and wherein the voltage amplifier is configured to be coupled to the printed circuit board only via the input and output nodes, wherein the two diodes are vertically separated along a vertical axis and positioned cross-wise to each other and positioned with electrical biases in opposite directions, the first diode is in a first diode plane parallel to the capacitor plane, and the second diode is in a second diode plane parallel to the first diode plane farther away from the capacitor plane than the first diode plane.

18. The electronic device of claim 17, comprising a controller electrically coupled to the printed circuit board, wherein the controller is configured to control an electrostatic spray device.

19. The electronic device of claim 17, comprising a dielectric coating disposed on the voltage amplifier, wherein the dielectric coating comprises an epoxy resin.

20. The electronic device of claim 19, wherein the dielectric coating is formed using potting techniques.

* * * * *